(12) United States Patent
Kuwana et al.

(10) Patent No.: US 8,531,187 B2
(45) Date of Patent: Sep. 10, 2013

(54) COMPENSATION CIRCUIT AND TEST APPARATUS

(75) Inventors: Yuji Kuwana, Gunma (JP); Naoki Matsumoto, Saitama (JP)

(73) Assignee: Advantest Corporation, Tokyo (JP)

( * ) Notice: Subject to any disclaimer, the term of this patent is extended or adjusted under 35 U.S.C. 154(b) by 690 days.

(21) Appl. No.: 12/652,550

(22) Filed: Jan. 5, 2010

(65) Prior Publication Data

US 2010/0190448 A1 Jul. 29, 2010

Related U.S. Application Data

(63) Continuation of application No. PCT/JP2008/062427, filed on Jul. 9, 2008.

(30) Foreign Application Priority Data

Jul. 9, 2007 (JP) ................................. 2007-180058

(51) Int. Cl.
*H03K 19/0175* (2006.01)

(52) U.S. Cl.
USPC ................................. 324/537; 327/1; 326/82

(58) Field of Classification Search
USPC ...... 324/537, 76.11, 713; 326/82; 327/1–99, 327/178; 341/120
See application file for complete search history.

(56) References Cited

U.S. PATENT DOCUMENTS

| | | | |
|---|---|---|---|
| 6,940,539 | B1 | 9/2005 | Tokman et al. |
| 2005/0242857 | A1* | 11/2005 | Minzoni ........................ 327/172 |
| 2006/0273943 | A1* | 12/2006 | Kawabata ...................... 341/120 |
| 2007/0103198 | A1* | 5/2007 | Matsumoto et al. ............ 326/82 |
| 2008/0198912 | A1 | 8/2008 | Wada et al. |

FOREIGN PATENT DOCUMENTS

| | | |
|---|---|---|
| JP | 11-68624 A | 3/1999 |
| JP | 2001-16141 A | 1/2001 |
| JP | 2004-120468 A | 4/2004 |

(Continued)

OTHER PUBLICATIONS

JP2004-120468 A, Abe Koichi, Kawasaki Microelectronics Inc., Apr. 15, 2004.*
International Search Report (ISR) issued in PCT/JP2008/062427 (patent application) for Examiner Consideration.
Written Option (PCT/ISA/237) issued in PCT/JP2008/062427 (patent application).

(Continued)

*Primary Examiner* — Melissa Koval
*Assistant Examiner* — Farhana Hoque

(57) ABSTRACT

Provided is a correction circuit for generating an output signal emphasizing a predetermined signal component of a supplied input signal, including: a first detection section that detects a waveform of the input signal; an amplifying section that amplifies the waveform detected by the first detection section; a correction signal generating section that generates a correction signal by extracting an alternate current component from the waveform amplified by the amplifying section; and an output signal generating section that superimposes the correction signal on the waveform of the input signal, thereby generating the output signal. The first detection section detects the waveform of the input signal and an inverted waveform thereof, the amplifying section amplifies the waveform and the inverted waveform of the input signal, the correction signal generating section generates a correction signal and an inverted correction signal by extracting an alternate current component respectively of the waveform and the inverted waveform of the input signal amplified by the amplifying section, and the output signal generating section generates a pair of differential signals for the output signal, by superimposing the correction signal on the waveform of the input signal and superimposing the inverted correction signal on the inverted waveform of the input signal.

19 Claims, 11 Drawing Sheets

(56) References Cited

FOREIGN PATENT DOCUMENTS

| | | |
|---|---|---|
| JP | 2006-337140 A | 12/2006 |
| TW | 200720687 A | 6/2007 |
| WO | 2006/028288 A1 | 3/2006 |
| WO | 2007/049674 A1 | 5/2007 |

OTHER PUBLICATIONS

Taiwanese Office Action dated Feb. 7, 2012, in a counterpart Taiwanese patent application No. 097125968.
Chinese Office Action dated May 3, 2012, in a counterpart Chinese patent application No. 200880023911.9.

* cited by examiner

//patents.google.com/patent/US8531187

COMPENSATION CIRCUIT AND TEST APPARATUS

This is a continuation application of PCT/JP2008/62427 filed on Jul. 9, 2008.

BACKGROUND

1. Technical Field

The present invention relates to a correction circuit and a test apparatus. In particular, the present invention relates to a correction circuit for generating an output signal emphasizing a predetermined signal component of a given input signal, and to a test apparatus for testing a device under test using the correction circuit.

2. Related Art

A test apparatus for supplying a test signal to a device under test and testing a signal under measurement outputted from the device under test is considered as a type of apparatuses for testing a device under test such as a semiconductor circuit. The acceptability of the device under test can be determined for example by examining whether a normal signal under measurement is outputted.

A transfer path for transferring signals is provided between the test apparatus and a device under test. However, a resistance, a capacity, and the like exist in the transfer path, which degrades the signal waveform. As a means to cope with this problem, a technology is already known to generate a test signal to be inputted to the device under test, by compensating for the loss in the transfer path of the waveform of the test signal (see for example Patent Document No. 1). There is also known a technology to compensate for the loss in the transfer path of the signal received from the device under test.

Patent Document No. 1: Japanese Patent Application Publication No. 2006-337140

One compensation method for loss is to generate a correction signal in accordance with the waveform of the original signal, and add the generated correction signal to the original signal. Such a correction signal can be generated by generating a differentiated waveform of the original signal, and amplifying the differentiated waveform in accordance with the amount of loss in the transfer path.

However, when the amplification factor of the differentiated waveform changes, the direct current component applied to a correction signal occasionally also fluctuates. By generating an output signal by adding a correction signal to an original signal, the direct current component of the output signal fluctuates in proportion to the amplification factor of the differentiated waveform, to degrade the direct current voltage accuracy of the output signal after the correction.

In addition, when compensating for the transfer path loss of a differential signal, the correction signal is required to be generated for each of the non-inversion signal and the inversion signal for the differential signal. In such a process, if variations are caused in the direct current components among correction signals for example due to characteristics variation in the elements generating these correction signals, the direct current voltage accuracy of the differential signal after correction will degrade.

SUMMARY

Therefore, it is an object of an aspect of the innovations herein to provide a correction circuit and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary correction circuit for generating an output signal emphasizing a predetermined signal component of a supplied input signal, includes: a first detection section that detects a waveform of the input signal; an amplifying section that amplifies the waveform detected by the first detection section; a correction signal generating section that generates a correction signal by extracting an alternate current component from the waveform amplified by the amplifying section; and an output signal generating section that superimposes the correction signal on the waveform of the input signal, thereby generating the output signal.

According to a first aspect related to the innovations herein, one exemplary test apparatus includes for testing a device under test, includes: a test signal generating section that generates a test signal to be inputted to the device under test; a correction circuit that inputs, to the device under test, the test signal generated by the test signal generating section after emphasizing a predetermined signal component of the test signal; a measurement section that measures a signal under measurement outputted by the device under test according to the test signal; and a determining section that determines acceptability of the device under test based on a measurement result of the measurement section, where the correction circuit includes: a first detection section that detects a waveform of the test signal; an amplifying section that amplifies the waveform detected by the first detection section; a correction signal generating section that generates a correction signal from which an alternate current component of the waveform amplified by the amplifying section has been extracted; and an output signal generating section that superimposes the correction signal on the waveform of the test signal, and inputs a resulting test signal to the device under test.

According to a first aspect related to the innovations herein, another exemplary test apparatus for testing a device under test, includes: a test signal generating section that generates a test signal to be inputted to the device under test; a correction circuit that receives a signal under measurement outputted from the device under test according to the test signal, and obtains a comparison result on whether a level of the signal under measurement is larger than a predetermined level, by compensating for a loss of the signal under measurement in a transfer path; and a determining section that determines acceptability of the device under test based on the comparison result obtained by the correction circuit, where the correction circuit includes: a first detection section that detects a waveform of the signal under measurement; an amplifying section that amplifies the waveform detected by the first detection section; a correction signal generating section that generates a correction signal by extracting an alternate current component from the waveform amplified by the amplifying section; an output signal generating section that superimposes the correction signal on the waveform of the signal under measurement; and a comparison result generating section that generates the comparison result based on the signal generated by the output signal generating section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
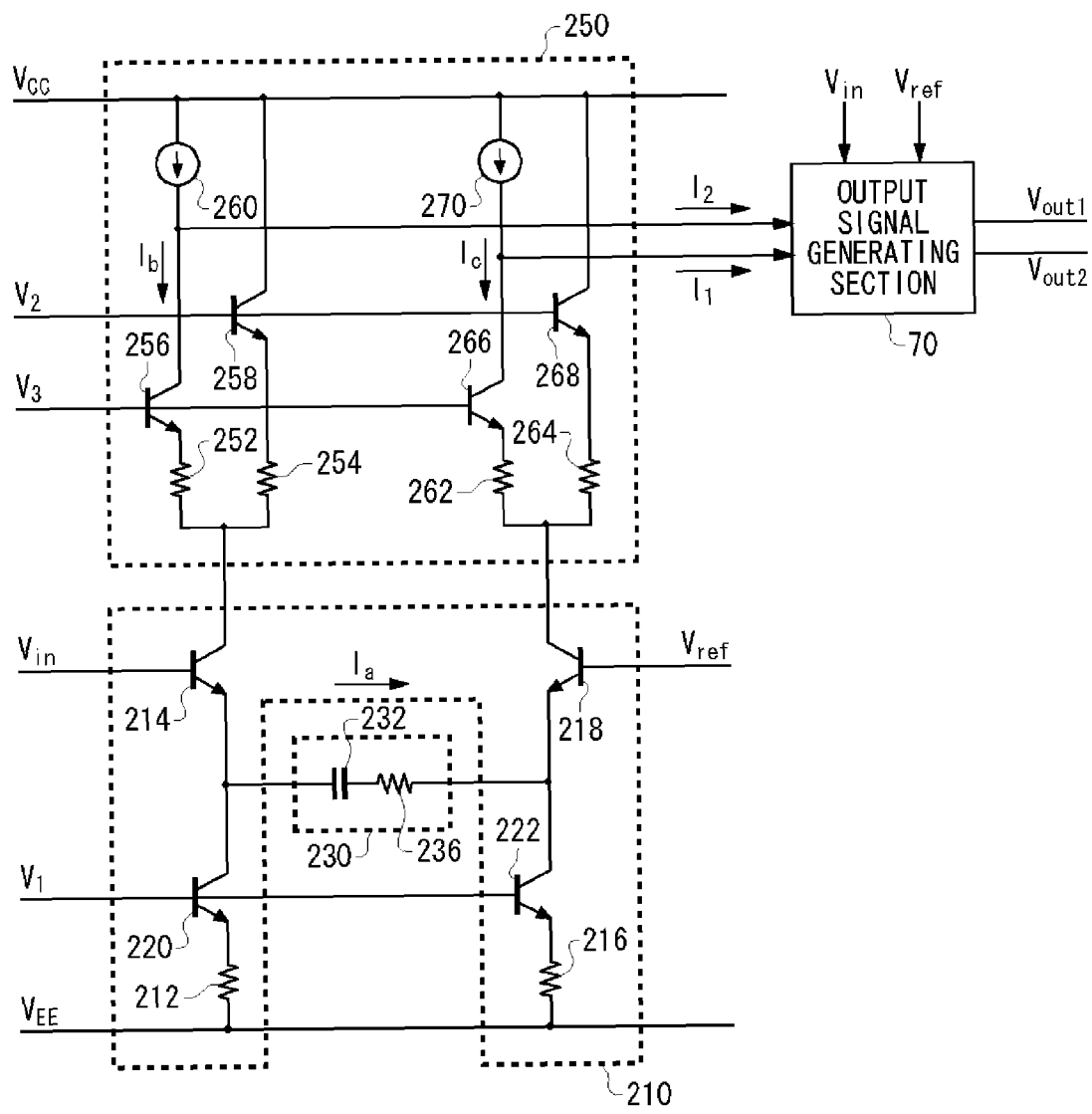
FIG. 1 shows an exemplary configuration of a correction circuit 200.

FIG. 1 shows an exemplary configuration of a correction circuit 200. The correction circuit 200 generates an output signal emphasizing a predetermined signal component of a given input signal. For example, the correction circuit 200 may generate an output signal emphasizing an alternate current component of the given input signal, so as to compensate for the attenuation of the input signal in the transfer path or the like. The correction circuit 200 includes a first detection section 210, a correction signal generating section 230, an amplifying section 250, and an output signal generating section 70.

The first detection section 210 detects the waveform of an input signal Vin. The first detection section 210 in the present example includes a transistor 214, a transistor 218, a transistor 220, a transistor 222, a resistance 212, and a resistance 216. The transistor 214 receives the input signal Vin at the base terminal thereof, and detects the waveform of the input signal Vin.

The transistor 220 has a collector terminal connected to the emitter terminal of the transistor 214, and a gate terminal thereof is provided with a predetermined voltage V1. The resistance 212 is connected between the emitter terminal of the transistor 220 and the power source line VEE. That is, the transistor 220 and the resistance 212 function as a current source for providing a current corresponding to the voltage V1.

The transistor 218 receives a predetermined reference voltage Vref at the base terminal thereof, and provides an emitter current corresponding to the reference voltage Vref. The transistor 218 may be provided in parallel with the transistor 214, and have the same characteristics as the transistor 214.

The transistor 222 has a collector terminal connected to the emitter terminal of the transistor 218. The gate terminal of the transistor 222 is connected to the gate terminal of the transistor 220, and is provided with a predetermined voltage V1. The resistance 216 is connected between the emitter terminal of the transistor 222 and the power source line VEE. The transistor 222 may have substantially the same characteristics as the transistor 220, and the resistance 216 may have substantially the same resistance value as the resistance 212. With this configuration, the transistor 222 and the resistance 216 provide substantially the same current as the transistor 220 and the resistance 212 do.

The correction signal generating section 230 generates a correction signal emphasizing the waveform of the input signal Vin. For example, the correction signal generating section 230 may extract an alternate current component Ia of the input signal Vin detected by the transistor 214, and set the alternate current component Ia as the correction signal Ia. The correction signal generating section 230 may extract, as the alternate current component Ia, a current signal obtained by charging and discharging the capacitor 232 by means of the input signal Vin given by the voltage signal.

The correction signal generating section 230 in the present example includes a capacitor 232 and a resistance 236 that are serially connected, between the emitter terminal of the transistor 214 and the emitter terminal of the transistor 218.

The capacitor 232 passes the alternative current component of the emitter current of the transistor 214. The capacitor 232 may also pass the frequency component of the emitter current of the transistor 214, which is in accordance with the resistance value of the resistance 212, the capacity of the capacitor 232, the resistance value of the resistance 236, and the like. For example, the capacitor 232 may pass a differentiated waveform of the waveform of the emitter current of the transistor 214.

Specifically, when the voltage value of the input signal Vin fluctuates, the correction signal generating section 230 provides the current Ia corresponding to the fluctuation of the input signal, from the transistor 214 to the transistor 218. During this, the transistor 220 generates a constant current, and so the emitter current of the transistor 214 increases corresponding to the current Ia provided to the correction signal generating section 230. Likewise, the emitter current of the transistor 218 decreases corresponding to the current Ia received from the correction signal generating section 230.

For example, the emitter current that is an addition between the correction signal (current Ia) and the constant current generated by the transistor 220 is supplied to the transistor 214. In addition, the emitter current resulting from subtracting the correction signal (current Ia) from the constant current generated by the transistor 222 is supplied to the transistor 218.

The amplifying section 250 amplifies the correction signal by amplifying the emitter current of the transistor 214 and of the transistor 218, and supplies the amplified correction signal to the output signal generating section 70. The amplifying section 250 in the present example includes a current source 260, a transistor 256, a resistance 252, a transistor 258, a resistance 254, a current source 270, a transistor 266, a resistance 262, a transistor 268, and a resistance 264.

The current source 260, the transistor 256, the resistance 252, the transistor 258, and the resistance 254 amplify the emitter current of the transistor 214 to which the correction signal is added, at a predetermined amplification factor, to adjust the amplitude of the correction signal. In the present example, the distribution ratio of the correction signal (current Ia) between the transistor 256 and the transistor 258 is adjusted, and the current running to the transistor 256 is taken out, thereby generating the correction signal whose amplitude is adjusted. In this case, the above-mentioned amplification factor may be smaller than 1.

The emitter terminal of the transistor 256 is connected to the collector terminal of the transistor 214, via the resistance 252. The emitter terminal of the transistor 258 is connected to the collector terminal of the transistor 214, via the resistance 254 provided in parallel with the resistance 252. The current source 260 is provided between the collector terminal of the transistor 256 and the power source line VCC. The collector terminal of the transistor 258 is connected to the power source line VCC.

With the stated configuration, by adjusting the voltage V3 provided to the gate terminal of the transistor 256 and the voltage V2 provided to the gate terminal of the transistor 258, the ratio of the current Ib which runs to the transistor 256, of all the current of the transistor 214 can be adjusted. In other words, by adjusting the ratio between the voltages V2 and V3, the emitter current of the transistor 214 can be provided to the transistor 256 at an arbitrary amplification factor smaller than or equal to 1. The amplifying section 250 provides the output signal generating section 70 with the current resulting from subtracting the current Ib running to the transistor 256 from the constant current generated by the current source 260, as an inverted correction signal I2.

Likewise, the current source 270, the transistor 266, the resistance 262, the transistor 268, and the resistance 264 amplify the emitter current of the transistor 218, after subtraction of the correction signal by the correction signal generating section 230. The connection relation between the transistor 218 and the current source 270, the transistor 266, the resistance 262, the transistor 268, and the resistance 264 in the amplifying section 250 is the same as the connection relation between the transistor 214 and the current source 260, the transistor 256, the resistance 252, the transistor 258, and the resistance 254 in the amplifying section 250.

Note that the gate terminal of the transistor 266 is provided with the voltage V3, and the gate terminal of the transistor 268 is provided with the voltage V2. That is, the amplification factor of the correction signal Ia adopted by the transistor 266 and the transistor 268 is controlled to be substantially the same as the amplification factor of the correction signal Ia adopted by the transistor 256 and the transistor 258. In addition, the amplifying section 250 provides the output signal generating section 70 with the current resulting from subtracting the current Ic running to the transistor 266 from the constant current generated by the current source 270, as a correction signal I1.

The output signal generating section 70 outputs output signals Vout1 and Vout2 that emphasize the waveform of the input signal Vin respectively based on the correction signal I1 and its inverted correction signal I2 provided from the amplifying section 250. For example, the output signal generating section 70 may generate the output signal Vout1 by superimposing the waveform of the correction signal I1 on the waveform of the current corresponding to the input signal Vin and then converting the resulting current waveform into a voltage waveform. Likewise, the output signal Vout2 may be generated by superimposing the waveform of the inverted correction signal I2 on the inverted waveform of the current corresponding to the input signal Vin, and then converting the resulting current waveform into a voltage waveform. With the stated configuration, in the differential output signal, the generated waveform is compensated for the loss in the transfer path.

Figure 2:
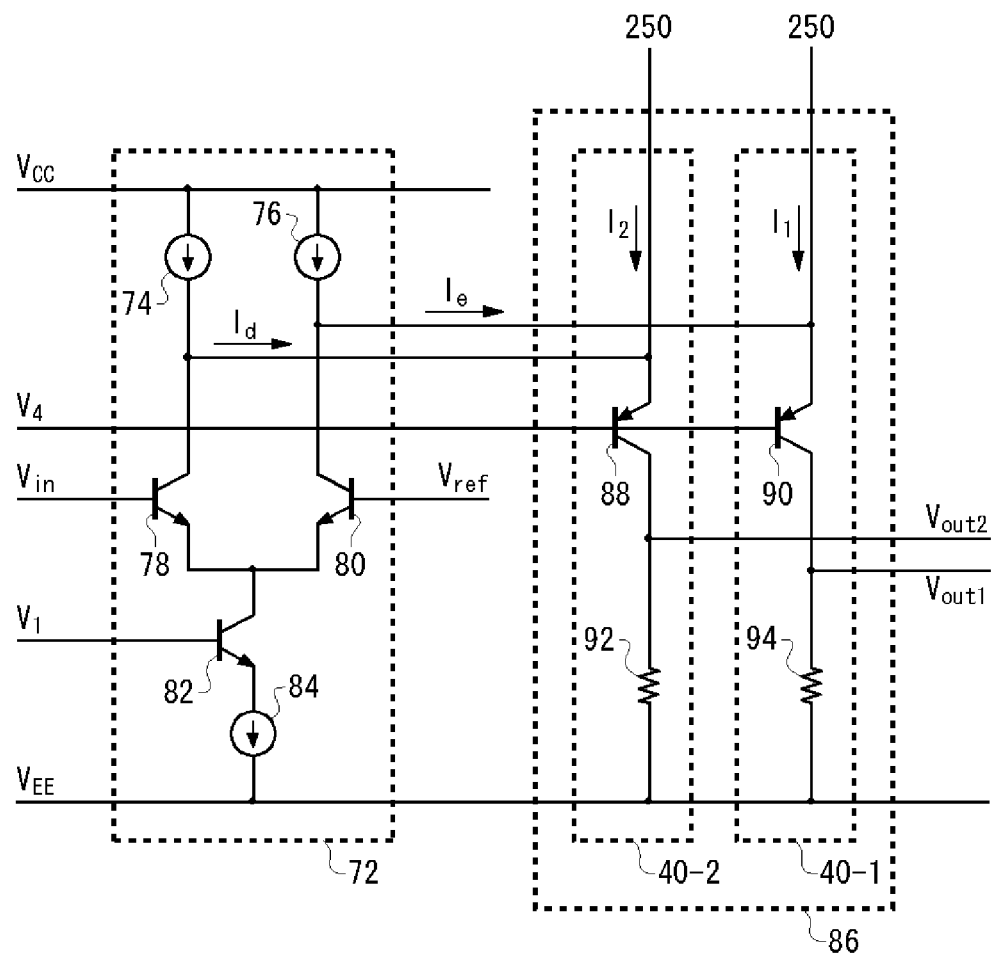
FIG. 2 shows an exemplary configuration of an output signal generating section 70.

FIG. 2 shows an exemplary configuration of the output signal generating section 70. The output signal generating section 70 includes a second detection section 72 and a superimposing section 86. The second detection section 72 detects the input signal Vin, and generates a differential signal corresponding to the input signal. The second detection section 72 in the present example includes a current source 74, a current source 76, a first differential transistor 78, a second differential transistor 80, a transistor 82, and a current source 84.

The first differential transistor 78 receives the input signal Vin at the gate terminal thereof. The second differential transistor 80 is provided in parallel with the first differential transistor 78, and receives a reference voltage Vref at the gate terminal thereof. The collector terminal of the transistor 82 is connected to the emitter terminal of the first differential transistor 78 and to the emitter terminal of the second differential transistor 80. The gate terminal of the transistor 82 is provided with the constant voltage V1, and the current source 84 is provided between the emitter terminal of the transistor 82 and the power source line VEE.

That is, the transistor 82 defines the summation of the current running to the first differential transistor 78 and the second differential transistor 80. For example, when the input voltage Vin increases, the current running to the first differential transistor 78 increases in proportion to the input voltage Vin. The current running to the second differential transistor 80 decreases in proportion to the current increase of the first differential transistor 78. With the stated configuration, a differential signal having the waveform of the input signal Vin and its inverted waveform can be generated.

The collector terminal of the first differential transistor 78 is connected to the power source line VCC via the current source 74, and the collector terminal of the second differential transistor 80 is connected to the power source line VCC via the current source 76. The current resulting from subtracting the current running to the first differential transistor 78 from the constant current generated by the current source 74 is transferred to the superimposing section 86, as the inverted waveform Id of the input signal. In addition, the current resulting from subtracting the current running to the second differential transistor 80 from the constant current generated by the current source 76 is transferred to the superimposing section 86, as the waveform Ie of the input signal.

The superimposing section 86 emphasizes a predetermined signal component of the differential signal detected by the second detection section 72, based on the correction signal and the inverted correction signal. For example, the superimposing section 86 may generate the output signal Vout1 by superimposing the correction signal I1 on the waveform Ie of the input signal detected by the second detection section 72. In addition, the superimposing section 86 may generate the output signal Vout2 by superimposing the inverted correction signal I2 on the inverted waveform Id of the input signal detected by the second detection section 72.

The superimposing section 86 in the present example includes a first correction section 40-1 and a second correction section 40-2. The first correction section 40-1 corrects the waveform Ie of the input signal detected by the second detection section 72, according to a first mirror current (correction signal I1). For example, the first correction section 40-1 may add the first mirror current I1 to the current waveform Ie of the input signal. In addition, the first correction section 40-1 may convert the generated current waveform into a voltage waveform, and output the voltage waveform.

The second correction section 40-2 corrects the inverted waveform Id of the input signal detected by the second detection section 72, according to a second mirror current (inverted correction signal I2). For example, the second correction section 40-2 may add the second mirror current I2 to the inverted current waveform Id of the input signal. In addition, the second correction section 40-2 may convert the generated current waveform into a voltage waveform, and output the voltage waveform.

The first correction section 40-1 includes a transistor 90 and a resistance 94. The transistor 90 runs a current corresponding to the current resulting from adding the non-inverted waveform Ie of the input signal and the correction signal I2, which is to be supplied to the emitter terminal. The gate terminal of the transistor 90 is provided with a constant voltage V4.

The resistance 94 is provided between the collector terminal of the transistor 90 and the power source line VEE. The resistance 94 generates a voltage waveform corresponding to the current waveform running to the transistor 90, and outputs the voltage waveform as the output signal Vout1. In the present example, the collector voltage of the transistor 90 is outputted as the output signal Vout1. With the stated configuration, an output signal emphasizing a predetermined signal component of the waveform of the input signal can be generated.

The second correction section 40-2 includes a transistor 88 and a resistance 92. The transistor 88 is provided in parallel with the transistor 90. The transistor 88 desirably has substantially the same characteristics as the transistor 90. The transistor 88 receives, at the emitter terminal thereof, a current being an addition between the inverted waveform Id of the input signal and the inverted correction signal I2. The gate terminal of the transistor 88 is provided with the constant voltage V4 that is the same voltage supplied to the transistor 90.

The resistance 92 is provided between the collector terminal of the transistor 88 and the power source line VEE. The resistance 92 generates a voltage waveform corresponding to the current waveform running to the transistor 88, and outputs the generated voltage waveform as the output signal Vout2. In the present example, the collector voltage of the transistor 88 is outputted as the output signal Vout2. With the stated configuration, an output signal emphasizing a predetermined signal component of the inverted waveform of the input signal can be generated.

Figure 3:
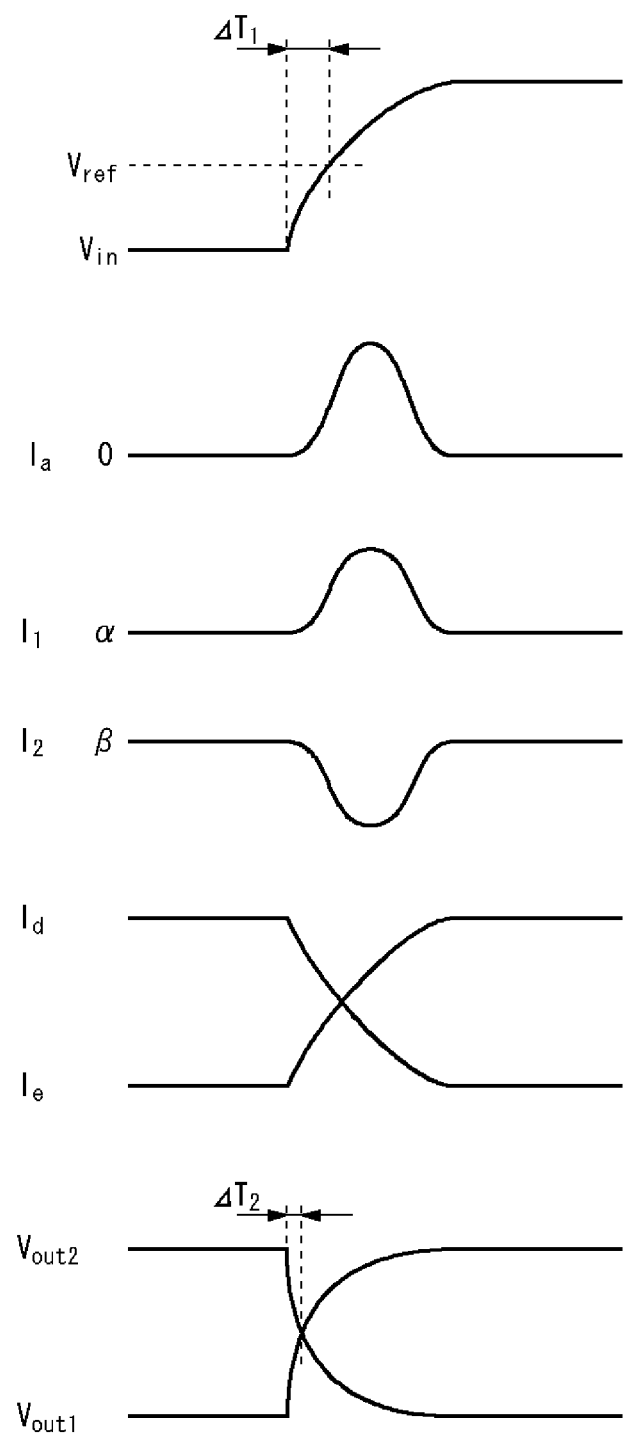
FIG. 3 shows an exemplary operation of the correction circuit 200.

FIG. 3 shows an exemplary operation of the correction circuit 200. As described above, the correction circuit 200 is provided with an input signal Vin attenuated by the transfer path. For example, as shown in FIG. 3, the high frequency component of the input signal Vin of a rectangular wave (shown by a wavy line) is attenuated in the transfer path or the like, into a waveform shown by a solid line.

For example, when the edge timing of the input signal Vin is detected by whether the level of the input signal Vin is larger than the predetermined reference value Vref, the loss in the above-mentioned transfer path causes the error ($\Delta T1$) in the edge timing of the original input signal. The correction circuit 200 reduces the error of the edge timing by compensating for the loss of the input signal.

As described above, the correction signal generating section 230 extracts the alternate current component of the input signal Vin, and generates the correction signal Ia. The correction signal generating section 230 may have a time constant corresponding to the time constant of the transfer path.

The correction signal Ia generated by the correction signal generating section 230 and its inverted signal are adjusted to an arbitrary amplitude by the amplifying section 250, to become the correction signal I1 and the inverted correction signal I2. Here, the direct current level $\alpha$ of the correction signal I1 is ideally equal to the direct current level $\beta$ of the inverted correction signal I2.

In addition, the second detection section 72 detects the non-inverted waveform Ie and the inverted waveform Id of the input signal. The superimposing section 86 generates the output signal Vout1 from the current resulting from adding the correction signal I1 to the non-inverted waveform Ie. In addition, the superimposing section 86 generates the output signal Vout2 from the current resulting from adding the inverted correction signal I2 to the inverted signal Id.

The error ($\Delta T2$) in the edge timing of the original input signal can be reduced by measuring the edge timing of the input signal from the crosspoint between the explained differential signals (Vout1 and Vout2). However, it is difficult to control the direct current levels respectively for the correction signal I1 and the inverted correction signal I2 in completely the same manner, due to the characteristics variations for each transistor and resistance in the first detection section 210 and the amplifying section 250. Moreover, as a result of changing the amplification factor in the amplifying section 250, the difference in direct current level between the correction signal I1 and the inverted correction signal I2 also fluctuates.

In this case, the direct current level of a signal outputted from the output signal generating section 70 fluctuates according to the fluctuation in difference of direct current level between the correction signal I1 and the inverted correction signal I2. This causes the direct current error in the output signal.

Figure 4:
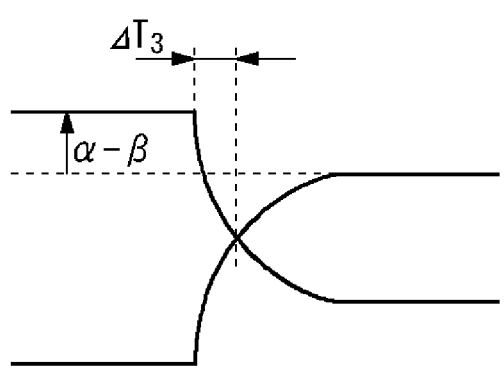
FIG. 4 shows another exemplary waveform of the output signal outputted from the output signal generating section 70.

FIG. 4 shows another exemplary waveform of the output signal outputted from the output signal generating section 70. As explained above, when the direct current level $\alpha$ of the correction signal I1 is different from the direct current level $\beta$ of the inverted correction signal I2, the output signal causes a direct current component corresponding to the difference. Therefore, the measurement error ($\Delta T3$) in timing at the crosspoint or the like also increases.

Figure 5:
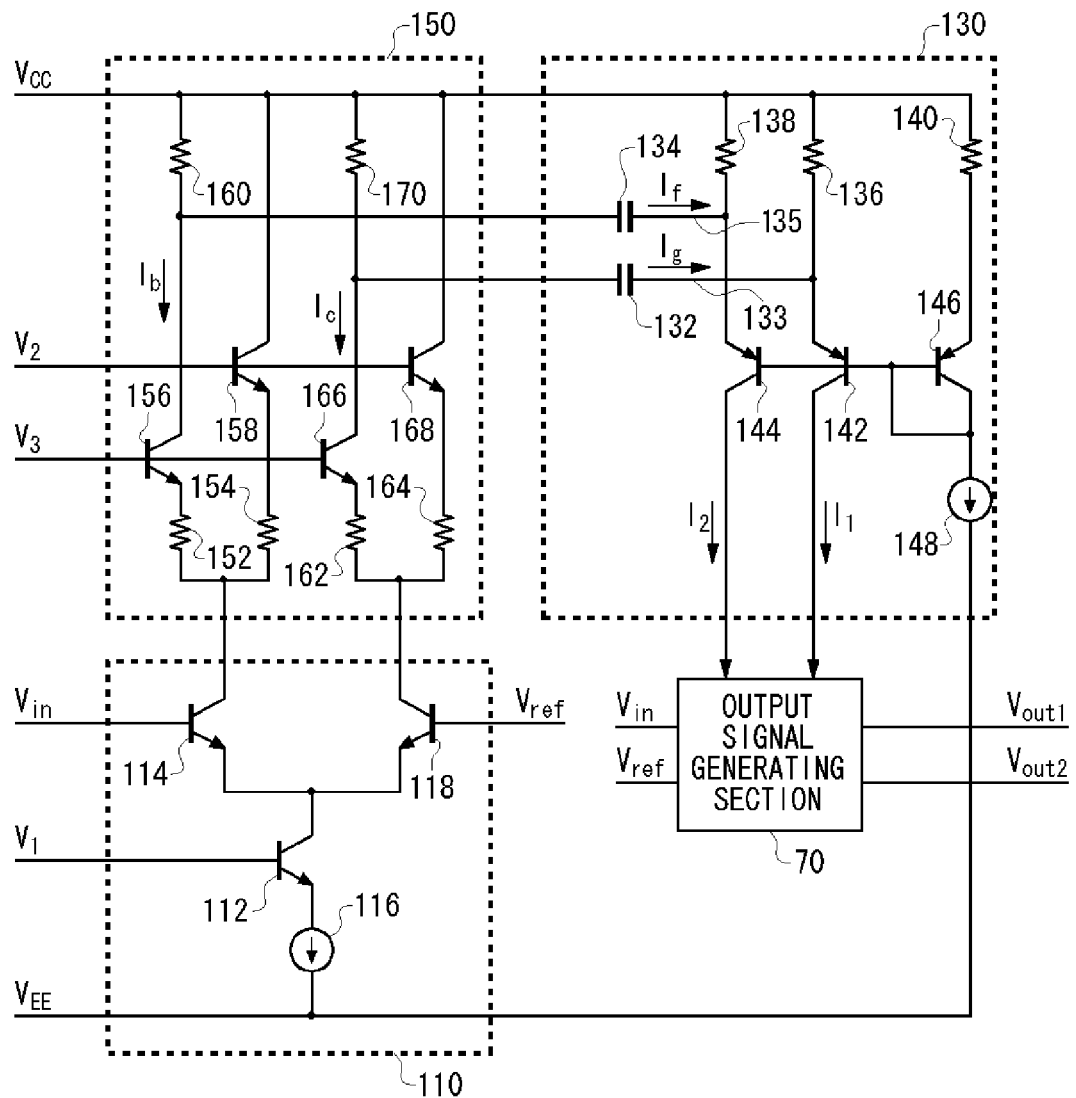
FIG. 5 shows an exemplary configuration of the correction circuit 100 according to an embodiment of the present invention.

FIG. 5 shows an exemplary configuration of the correction circuit 100 according to an embodiment of the present invention. The correction circuit 100 generates an output signal emphasizing a predetermined signal component of a given input signal, and includes a first detection section 110, an amplifying section 150, a correction signal generating section 130, and an output signal generating section 70.

The overview of the correction circuit 100 is explained first. The first detection section 110 detects the waveform of the input signal Vin. The first detection section 110 may further detect an inverted waveform of the input signal Vin. The amplifying section 150 amplifies the waveform of the input signal Vin detected by the first detection section 110. In addition, the amplifying section 150 may amplify the inverted waveform of the input signal Vin and the inverted waveform of the input signal Vin respectively.

The correction signal generating section 130 extracts the alternate current component of the waveform of the input signal Vin after amplification by the amplifying section 150, to generate a correction signal. The correction signal generating section 130 may extract the alternate current component of the inverted waveform of the input signal Vin after amplification by the amplifying section 150. In this case, the correction signal generating section 130 may generate the correction signal and the inverted correction signal from the waveform of the input signal Vin and its inverted waveform.

For example, the correction signal may be generated from the alternate current component of the waveform of the input signal Vin, or the correction signal may be generated from the alternate current component of the inverted waveform of the input signal Vin. Likewise, the inverted correction signal may be generated from the alternate current component of the inverted waveform of the input signal Vin, or the inverted correction signal may be generated from the alternate current component of the waveform of the input signal Vin.

The output signal generating section 70 superimposes the correction signal to the waveform of the input signal Vin, to generate an output signal. The output signal generating section 70 may further generate a signal resulting from superimposing the inverted correction signal to the inverted waveform of the input signal Vin, to generate a pair of differential signals of the output signal.

The correction circuit 200 explained with reference to FIGS. 1-4 generates a correction signal having an arbitrary amplitude, by generating a correction signal Ia and then amplifying this correction signal Ia. Therefore, a direct current error may be caused during the amplification. As opposed to this, the correction circuit 100 in the present example generates a correction signal by amplifying the waveform of the detected input signal to adjust the amplitude, and then extracting the alternate current component of the waveform. Therefore, the direct current component of the correction signal can be eliminated, thereby reducing the direct current error caused due to the element variation, the change in amplification factor, or the like.

The first detection section 110 in the present example includes a transistor 114, a transistor 118, a transistor 112, and a current source 116. The transistor 114 receives an input signal Vin at the gate terminal thereof. The transistor 118 is provided in parallel with the transistor 114, and receives the reference voltage Vref at the gate terminal thereof. The collector terminal of the transistor 112 is connected to the emitter terminal of the transistor 114 and to the emitter terminal of the transistor 118. In addition, the gate terminal of the transistor 112 is provided with a constant voltage V1, and the current source 116 is provided between the emitter terminal of the transistor 112 and the power source line VEE.

That is, the transistor 112 defines the summation of the current running to the transistor 114 and the transistor 118. For example, when the input voltage Vin has increased, the current running to the transistor 114 increases in proportion to the input voltage Vin. The current running to the transistor 118 decreases in proportion to the current increase of the transistor 114. With the stated configuration, a differential signal having the waveform of the input signal Vin and its inverted waveform can be generated.

The amplifying section 150 includes resistances (152, 154, 160), transistors (156, 158), resistances (162, 164, 170), and transistors (166, 168). The resistance 160 and the resistance 170 function as the current source 260 and the current source 270 explained with reference to FIG. 1. The operation of the amplifying section 150 is the same as the operation of the amplifying section 250 explained with reference to FIGS. 1-4, and so the explanation thereof is omitted.

The correction signal generating section 130 includes a first capacitor 132, a second capacitor 134, a first control wiring 133, a second control wiring 135, three resistances (136, 138, 140), a reference transistor 146, a first mirror transistor 142, a second mirror transistor 144, and a current source 148. The reference transistor 146, the first mirror transistor 142, and the second mirror transistor 144 are provided in parallel to each other, and the gate terminals of them are connected to each other. The collector terminal of the reference transistor 146 is connected to the gate terminal. The three transistors may have substantially the same characteristics as each other. That is, the first mirror transistor 142 and the second mirror transistor 144 function as a mirror circuit for providing substantially the same current as the current provided to the reference transistor 146.

The resistance 140 is provided between the emitter terminal of the reference transistor 146 and the power source line VCC. The resistance 136 is provided between the emitter terminal of the first mirror transistor 142 and the power source line VCC, and the resistance 138 is provided between the emitter terminal of the second mirror transistor 144 and the power source line VCC. These three resistances may have substantially the same resistance value as each other.

The collector terminal of the reference transistor 146 is connected to the power source line VEE via the current source 148. With the stated configuration, the first mirror transistor 142 and the second mirror transistor 144 are provided with the same first mirror current and second mirror current according to a constant reference current defined by the current source 148.

The first capacitor 132 passes the alternate current component of the waveform of the input signal after amplification by the amplifying section 150, to generate a correction signal Ig. The first capacitor 132 in the present example is provided between the collector terminal of the transistor 166 and the emitter terminal of the first mirror transistor 142.

The second capacitor 134 passes the alternate current component of the inverted waveform of the input signal after amplification of the amplifying section 150, to generate an inverted correction signal If. The second capacitor 134 in the present example is provided between the collector terminal of the transistor 156 and the emitter terminal of the second mirror transistor 144.

The first control wiring 133 superimposes a correction signal on the first mirror current by controlling the emitter potential of the first mirror transistor 142 based on the correction signal Ig generated by the first capacitor 132. The first control wiring 133 in the present example connects the first capacitor 132 to the emitter terminal of the first mirror transistor 142, to superimpose the correction signal on the first mirror current.

The second control wiring 135 superimposes an inverted correction signal on the second mirror current by controlling the emitter potential of the second mirror transistor 144 based on the inverted correction signal If generated by the second capacitor 134. The second control wiring 135 in the present example connects the second capacitor 134 to the emitter terminal of the second mirror transistor 144, to superimpose the inverted correction signal on the second mirror current.

The output signal generating section 70 emphasizes a predetermined signal component of the input signal Vin based on the correction signal I1 (first mirror current) and the inverted correction signal I2 (second mirror current) provided by the correction signal generating section 130. The output signal generating section 70 may have the same function and configuration as those of the output signal generating section 70 explained with reference to FIG. 2. However, note that the output signal generating section 70 in the present example receives a correction signal and an inverted correction signal from the correction signal generating section 130, while the output signal generating section 70 in FIG. 2 receives a correction signal and an inverted correction signal from the amplifying section 250.

With the stated configuration, the direct current level can be kept the same (substantially 0) in the correction signal Ig and the inverted correction signal If. Since the correction signal Ig and the inverted correction signal If are superimposed on the first mirror current and on the second mirror current controlled to be the same by the current mirror circuit, the direct current components of the correction signal I2 and the inverted correction signal I1 after superimposition on the mirror current can be controlled to be the same with accuracy. This reduces the direct current error due to the correction signal I2 and the inverted correction signal I1.

Figure 6:
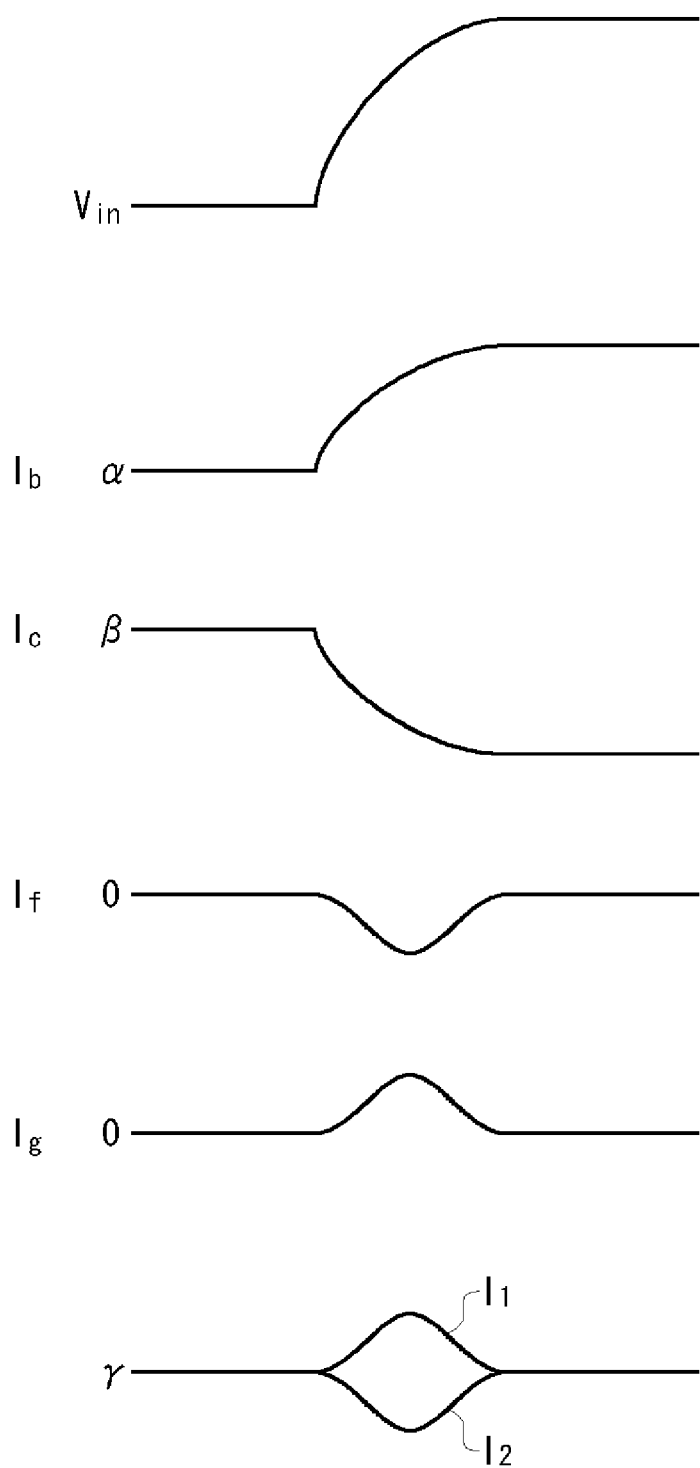
FIG. 6 shows an exemplary operation of the correction circuit 100.

FIG. 6 shows an exemplary operation of the correction circuit 100. Just as in the example of FIG. 3, the correction circuit 100 is provided with an input signal Vin attenuated in the transfer path. The first detection section 110 detects the waveform of the input signal Vin. Note that FIG. 6 does not draw the inverted waveform of the input signal Vin.

The amplifying section 150 generates waveforms Ib and Ic resulting from amplifying the amplitudes of the waveform and the inverted waveform of the input signal Vin detected by the first detection section 110 at a predetermined amplification factor. Note that the amplification factor for the waveform of the input signal Vin is the same as the amplification factor for the inverted waveform thereof. This amplification factor may be equal to or smaller than 1.

The first capacitor 132 and the second capacitor 134 respectively extract the alternate current component of the waveforms Ib and Ic, to generate the correction signal Ig and the inverted correction signal If. During this process, the direct current component of the respective signals will be eliminated, and so the direct current level of the correction signal Ig and the inverted correction signal If will be substantially 0.

Then, the correction signal I1 is generated by superimposing the correction signal Ig on the first mirror current, and the inverted correction signal I2 is generated by superimposing the inverted correction signal If on the second mirror current. Note that the first mirror current and the second mirror current are controlled to have the same current value by means of the current mirror circuit. Therefore, the direct current levels of the correction signal I1 and the inverted correction signal I2 will be the same as each other.

Thus generated correction signal I1 and inverted correction signal I2 are superimposed on a non-inverted signal Ie and an inverted signal Id as shown in FIG. 3, to obtain a differential output signal whose loss in the transfer path has been compensated for, as shown in FIG. 3. In addition, the direct current error due to the correction signal I1 and the inverted correction signal I2 can be reduced as stated above.

Figure 7:
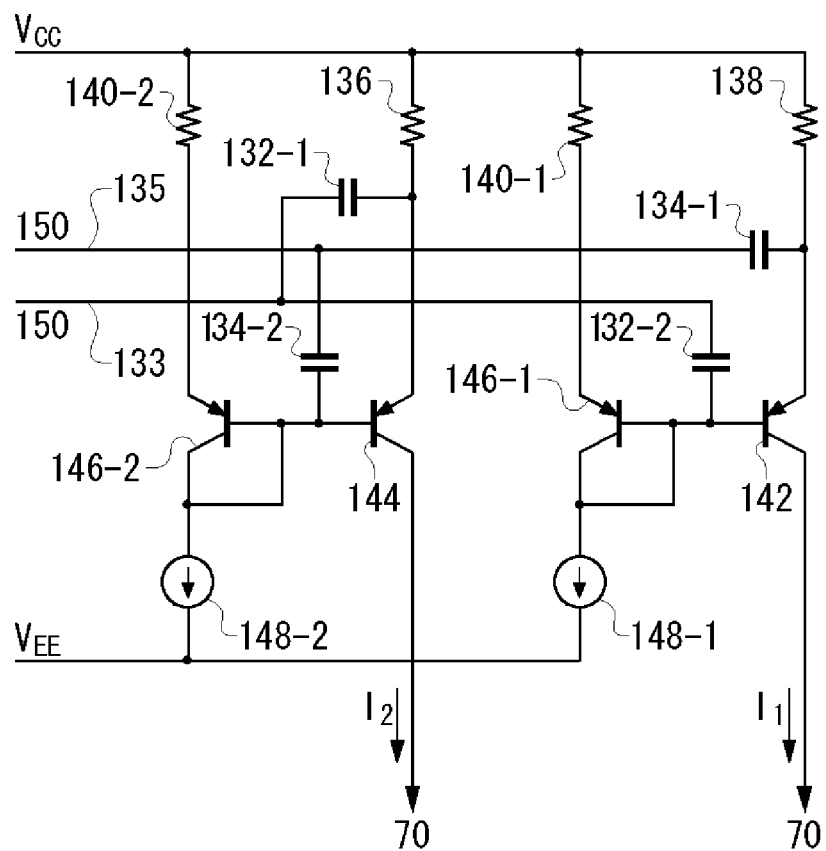
FIG. 7 shows another exemplary configuration of a correction signal generating section 130.

FIG. 7 shows another exemplary configuration of a correction signal generating section 130. In contrast to the configuration of the correction signal generating section 130 shown in FIG. 5, the correction signal generating section 130 includes two first capacitors 132, two second capacitors 134, two resistances 140, two reference transistors 146, and two current sources 148.

In addition, in the correction signal generating section 130 in FIG. 5, the base terminals of the first mirror transistor 142 and the second mirror transistor 144 are connected to the base terminal of a common reference transistor 146, while in the correction signal generating section 130 in the present example, the base terminal of the first mirror transistor 142 is connected to the base terminal of the first reference transistor 146-1, and the base terminal of the second mirror transistor 144 is connected to the base terminal of the second reference transistor 146-2 which is different from the first reference transistor 146-1. In addition, each reference transistor 146 is connected to a resistance 140 and a current source 148, just as the reference transistor shown in FIG. 5.

The first capacitor 132-1 is provided between the amplifying section 150 and the emitter terminal of the first mirror transistor 142. The first capacitor 132-2 is provided between the amplifying section 150 and the gate terminal of the second mirror transistor 144. The first capacitors 132-1 and 132-2 may be the same as the first capacitor 132 explained with reference to FIG. 5.

The second capacitor 134-1 is provided between the amplifying section 150 and the emitter terminal of the second mirror transistor 144. The second capacitor 134-2 is provided between the amplifying section 150 and the gate terminal of the first mirror transistor 142. The second capacitors 134-1 and 134-2 may be the same as the second capacitor 134 explained with reference to FIG. 5.

The first control wiring 133 controls, based on the correction signal Ig, the base voltage of each of the first reference transistor 146-1 and the first mirror transistor 142, and the emitter voltage of the second mirror transistor 144. For example, the first control wiring 133 may control the base voltage and the emitter voltage mentioned above, by changing, according to the correction signal Ig, the base current of each of the first reference transistor 146-1 and the first mirror transistor 142 and the emitter current of the second mirror transistor 144.

Likewise, the second control wiring 135 controls, based on the inverted correction signal If, the base voltage of each of the second reference transistor 146-2 and the second mirror transistor 144, and the emitter voltage of the first mirror transistor 142. For example, the second control wiring 135 may control the base voltage and the emitter voltage mentioned above, by changing, according to the inverted correction signal If, the base current of each of the second reference transistor 146-2 and the second mirror transistor 144 and the emitter current of the first mirror transistor 142.

Figure 8:
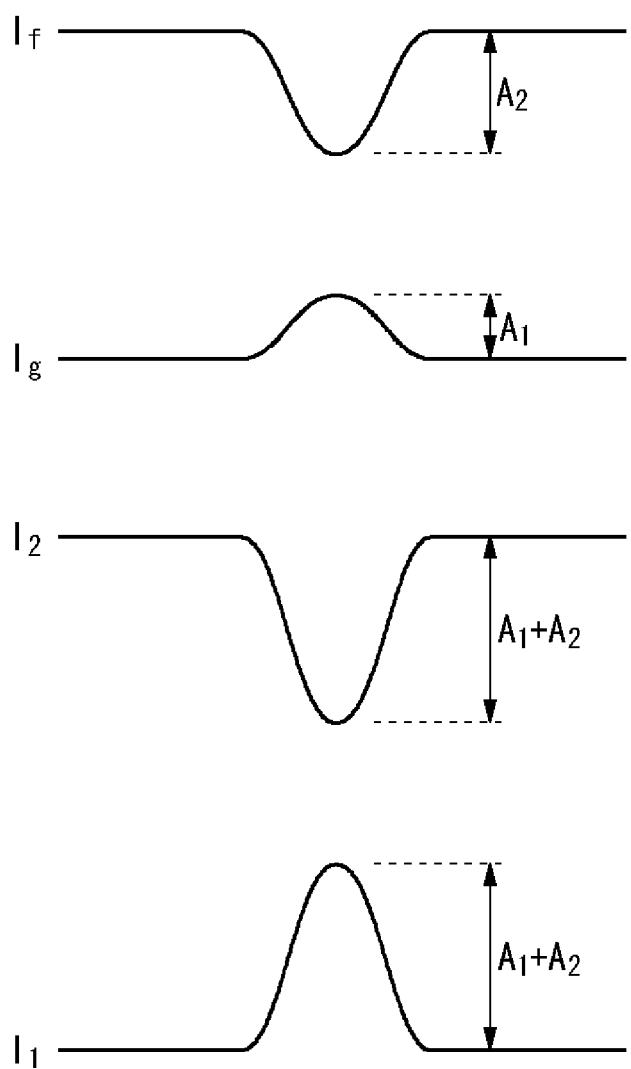
FIG. 8 shows an exemplary operation of the correction signal generating section 130 shown in FIG. 7.

FIG. 8 shows an exemplary operation of the correction signal generating section 130 shown in FIG. 7. In the amplifying section 150, the amplification factors for waveform of an input signal and its inverted waveform are defined in the ratio between the common voltages V2 and V3 and therefore are ideally the same as each other. Therefore, in the configuration of the correction signal generating section 130 explained with reference to FIG. 5, the amplitudes of the correction signal Ig and the inverted correction signal If, outputted from the first capacitor 132 and the second capacitor 134, become the same as each other, as shown in FIG. 6.

However, the amplification factor of the waveform of an input signal and the amplification factor of its inverted waveform may occasionally be different from each other, due to variations of element characteristics in the amplifying section 150. If this happens, the amplitude A1 of the correction signal Ig and the amplitude A2 of the inverted correction signal If, added to the first mirror current and the second mirror current, will be different from each other.

In contrast, with the configuration stated with reference to FIG. 7, the correction signal generating section 130 in the present example adds the summation between the correction signal Ig and the inverted correction signal If to the first mirror current I1. In addition, the summation between the correction signal Ig and the inverted correction signal If is subtracted from the second mirror current I2. Therefore even when the amplitude A1 of the correction signal Ig and the amplitude A2 of the inverted correction signal If are different from each other, the amplitudes of the correction signal and the inverted correction signal added to the first mirror current I1 and the second mirror current I2 can be equal to each other. Consequently, it becomes possible to emphasize a signal component in a differential signal more accurately.

Figure 9:
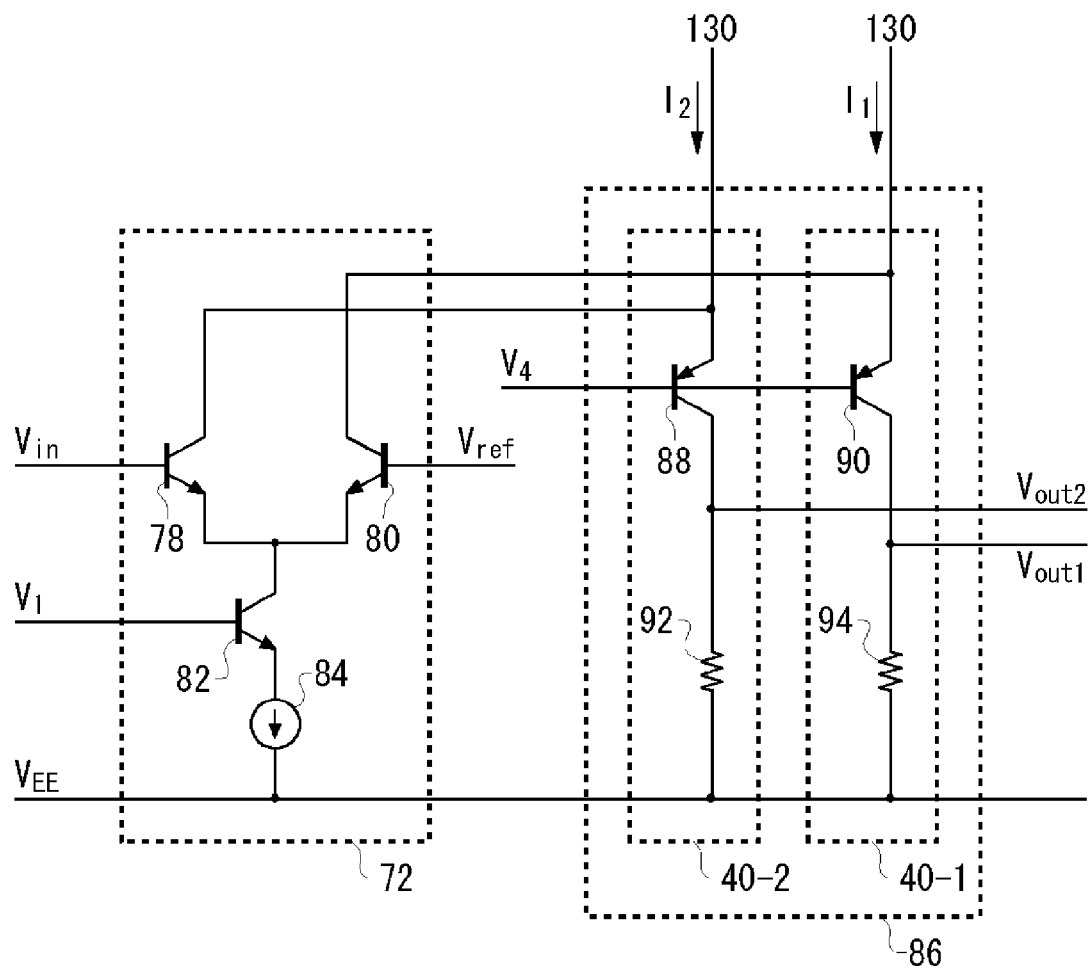
FIG. 9 shows another exemplary configuration of the output signal generating section 70.

FIG. 9 shows another exemplary configuration of the output signal generating section 70. The output signal generating section 70 in the present example includes a second detection section 72 and a superimposing section 86. The configuration of the superimposing section 86 may be the same as the configuration of the superimposing section 86 explained with reference to FIG. 2.

The second detection section 72 in the present example is different from the superimposing section 86 explained with reference to FIG. 2, in that it does not include a current source 74 or a current source 76. The first differential transistor 78, the second differential transistor 80, the transistor 82, and the current source 84 may be the same as the first differential transistor 78, the second differential transistor 80, the transistor 82, and the current source 84 explained with reference to FIG. 2. Note that the collector terminal of the first differential transistor 78 is connected to the second mirror transistor 144, and the collector terminal of the second differential transistor 80 is connected to the first mirror transistor 142.

With the stated configuration, the current is provided to the first differential transistor 78 and the second differential transistor 80, from the first mirror transistor 142 and the second mirror transistor 144. That is, the current source 74 and the current source 76 are eliminated, to reduce the circuit size.

Figure 10:
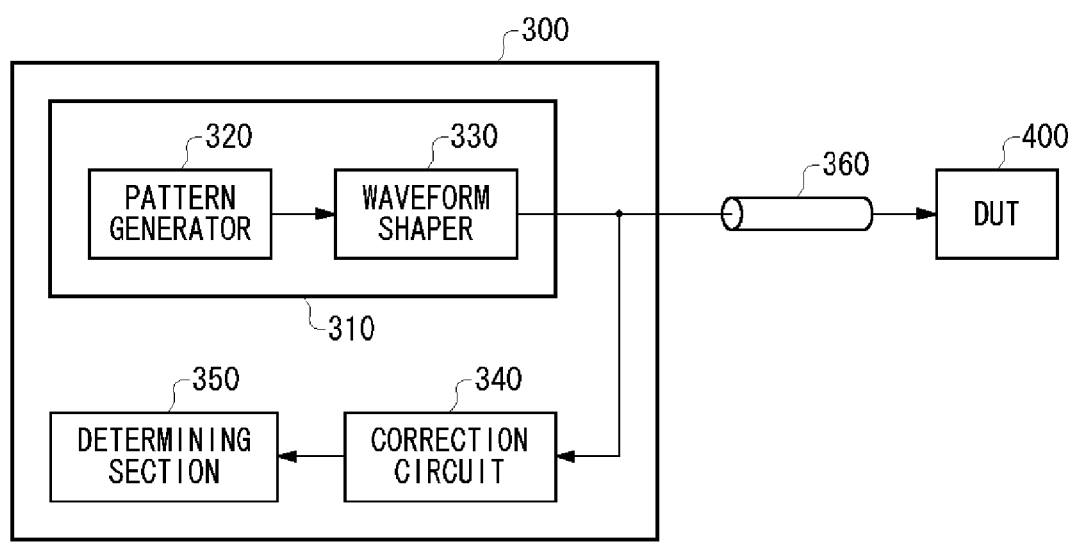
FIG. 10 shows an exemplary configuration of a test apparatus 300 according to an embodiment of the present invention.

FIG. 10 shows an exemplary configuration of a test apparatus 300 according to an embodiment of the present invention. The test apparatus 300 tests a device under test 400 such as a semiconductor chip, and includes a test signal generating section 310, a correction circuit 340, and a determining section 350. The test apparatus 300 is electrically connected to the device under test 400, by means of a transfer path 360 including a pattern wiring, a cable, or the like.

The test signal generating section 310 generates a test signal to be inputted to the device under test 400, and inputs the test signal via the transfer path 360. For example, the test signal generating section 310 inputs, to the device under test 400, a test signal including a predetermined logical pattern, and causes the device under test 400 to operate according to the logical pattern.

The test signal generating section 310 includes a pattern generator 320 and a waveform shaper 330. The pattern generator 320 executes a test program provided from a user or the like, to generate a logical pattern to be included in a test signal. The waveform shaper 330 shapes the waveform of the test signal that includes the logical pattern generated by the pattern generator 320.

The device under test 400 operates according to the inputted test signal, to output a signal under measurement corresponding to the operation result. For example, the device under test 400 may include a digital circuit operating according to a test signal, or a memory circuit outputting data of an address corresponding to a test signal.

The correction circuit 340 receives the signal under measurement outputted from the device under test 400 in response to a test signal, and obtains a comparison result on whether the level of the signal under measurement is larger than a predetermined reference level, by compensating for the loss of the signal under measurement in the transfer path. The correction circuit 340 may be the same as either the correction circuit 100 or the correction circuit 200 explained above with reference to FIGS. 1-9.

The correction circuit 340 in the present example receives a signal under measurement, as an input signal explained with reference to FIGS. 1-9. The reference level in the present example may be a middle level between the voltage level of the L logic and the voltage level of the H logic in the signal under measurement. The correction circuit 340 may supply, to the determining section 350, the output signal explained with reference to FIGS. 1-9, as a comparison result.

The determining section 350 determines the acceptability of the device under test 400 based on the comparison result obtained by the correction circuit 340. For example, the determining section 350 may sequentially detect the logical values of the supplied comparison result, at the timings of the supplied clock signal. The acceptability of the device under test 400 may be determined by comparing the detected logical pattern with the expected logical pattern. The expected logical pattern may be generated by the pattern generator 320 based on the logical pattern of the test signal.

The test apparatus 300 in the present example can measure a signal under measurement, by emphasizing a predetermined signal component of the signal under measurement to compensate for the loss of it in the transfer path 360. Consequently, the effect of the transfer path 360 in a test can be decreased, to be able to conduct a test of the characteristics of the implementation state of the device under test 400 with accuracy. Note that the characteristics of each element of the correction circuit 340 may be set according to the characteristics of the transfer path 360.

Figure 11:
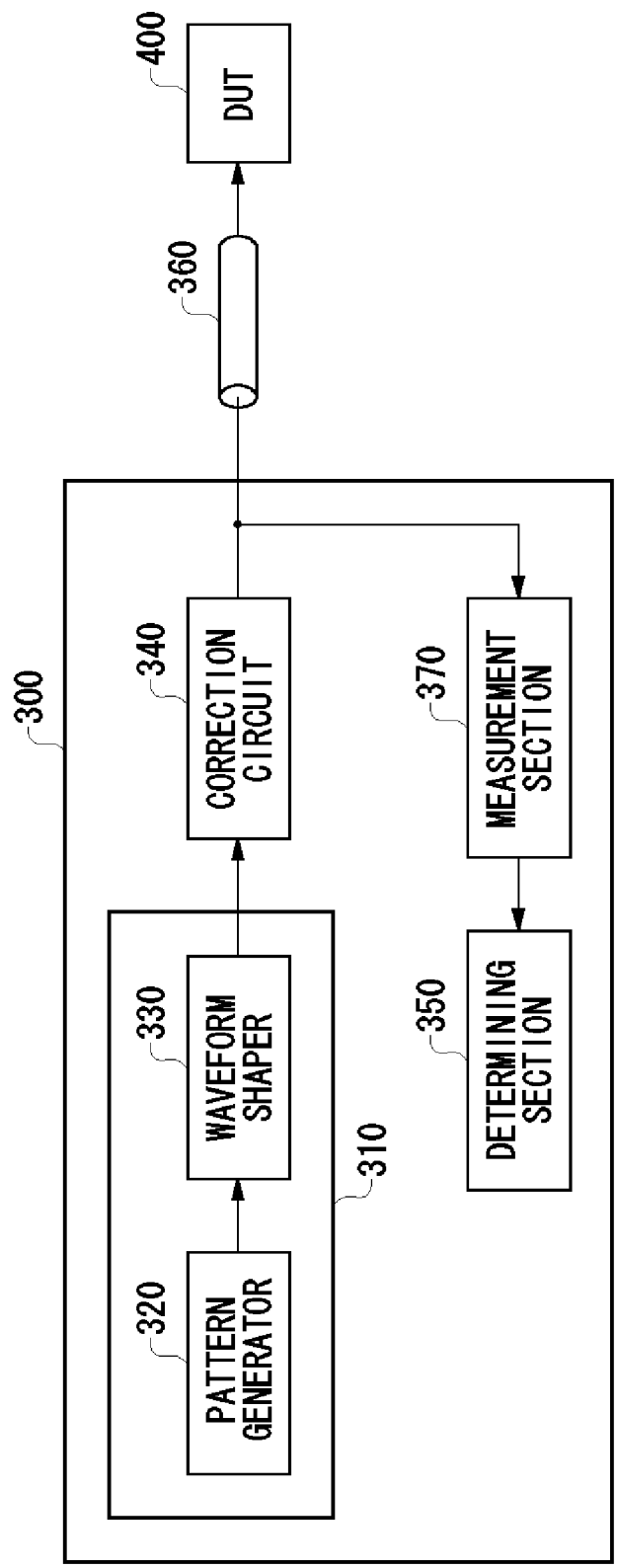
FIG. 11 shows another exemplary configuration of the test apparatus 300.

FIG. 11 shows another exemplary configuration of the test apparatus 300. In contrast to the configuration of the test apparatus 300 shown in FIG. 10, the test apparatus 300 in the present example further includes a measurement section 370. Moreover, the correction circuit 340 is provided between a test signal generating section 310 and a transfer path 360, and emphasizes a predetermined signal component of a test signal.

The measurement section 370 measures a signal under measurement received from a device under test 400. For example, the measurement section 370 may output a comparison result showing which of the signal level of the signal under measurement and a predetermined reference level is larger. The determining section 350 determines the acceptability of the device under test 400 based on the comparison result of the measurement section 370.

With the stated configuration, a test of the device under test 400 can be pursued using a test signal whose loss in the transfer path 360 has been compensated for in advance. As a result, the device under test 400 can be tested with accuracy. Note that the configuration of FIG. 11 may further include a correction circuit 340, instead of the measurement section 370. That is, the test apparatus 300 may include a correction circuit 340 for supplying, to the device under test 400, a test signal after emphasizing a predetermined signal component of the test signal, and a correction circuit 340 for measuring a signal under measurement by emphasizing a predetermined signal component. Accordingly, the device under test 400 can be tested with even more accuracy, by compensating for both of the losses of the test signal and the signal under measurement.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

For example, it is clear that the technical scope of the present invention includes an embodiment in which the PNP transistor shown in FIGS. 1-9 is replaced with an NPN transistor, and the NPN transistor shown in FIGS. 1-9 is replaced with a PNP transistor.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As described above, the embodiments of the present invention can compensate for the loss of a signal in a transfer path. Furthermore, when adjusting the amplification factor of a correction signal for adjusting the loss compensation, the amplification factor of the correction signal can be adjusted without causing any direct current error. The direct current error due to element variations or the like can also be eliminated.

What is claimed is:

1. A correction circuit for generating an output signal emphasizing a predetermined signal component of a supplied input signal, comprising:
   a first detection section that detects a waveform of the input signal;
   an amplifying section that amplifies the waveform detected by the first detection section;
   a correction signal generating section that generates a correction signal by extracting an alternate current component from the waveform amplified by the amplifying section; and
   an output signal generating section that superimposes the correction signal on the waveform of the input signal, thereby generating the output signal.

2. The correction circuit according to claim 1, wherein
   the first detection section detects the waveform of the input signal and an inverted waveform thereof,
   the amplifying section amplifies the waveform and the inverted waveform of the input signal,
   the correction signal generating section generates a correction signal and an inverted correction signal by extracting an alternate current component respectively of the waveform and the inverted waveform of the input signal amplified by the amplifying section, and
   the output signal generating section generates a pair of differential signals for the output signal, by superimposing the correction signal on the waveform of the input signal and superimposing the inverted correction signal on the inverted waveform of the input signal.

3. The correction circuit according to claim 2, wherein
   the output signal generating section includes:
   a second detection section that detects the waveform of the input signal and the inverted waveform of the input signal; and
   a superimposing section that superimposes the correction signal on the waveform of the input signal detected by the second detection section, and superimposes the inverted correction signal on the inverted waveform of the input signal detected by the second detection section.

4. The correction circuit according to claim 3, wherein
   the correction signal generating section includes:
   a first capacitor that passes an alternate current component of the waveform of the input signal amplified by the amplifying section, thereby generating the correction signal;
   a second capacitor that passes an alternate current component of the inverted waveform of the input signal amplified by the amplifying section, thereby generating the inverted correction signal;
   a reference transistor that provides a predetermined reference current;
   a first mirror transistor that provides a first mirror current according to the reference current, a base terminal of the first mirror transistor being connected to a base terminal of the reference transistor;
   a second mirror transistor that provides a second mirror current according to the reference current, a base terminal of the second mirror transistor being connected to the base terminal of the reference transistor;
   a first control wiring that superimposes the correction signal on the first mirror current by controlling an emitter potential of the first mirror transistor based on the correction signal; and
   a second control wiring that superimposes the inverted correction signal on the second mirror current by controlling an emitter potential of the second mirror transistor based on the inverted correction signal, and
   the superimposing section includes:
   a first correction section that corrects the waveform of the input signal detected by the second detection section, according to the first mirror current; and
   a second correction section that corrects the inverted waveform of the input signal detected by the second detection section, according to the second mirror current.

5. The correction circuit according to claim 4, wherein
   the second detection section includes a first differential transistor and a second differential transistor that detect the waveform and the inverted waveform of the input signal,
   one of the first and second differential transistors is connected to the first mirror transistor, and
   the other of the first and second differential transistors is connected to the second mirror transistor.

6. The correction circuit according to claim 3, wherein
   the correction signal generating section includes:
   a first capacitor that passes an alternate current component of the waveform of the input signal amplified by the amplifying section, thereby generating the correction signal;
   a second capacitor that passes an alternate current component of the inverted waveform of the input signal amplified by the amplifying section, thereby generating the inverted correction signal;
   a first reference transistor that provides a predetermined reference current;
   a first mirror transistor that provides a first mirror current according to the reference current provided by the first reference transistor, a base terminal of the first mirror transistor being connected to a base terminal of the first reference transistor;
   a second reference transistor that provides a predetermined reference current;
   a second mirror transistor that provides a second mirror current according to the reference current provided by the second reference transistor, a base terminal of the second mirror transistor being connected to a base terminal of the second reference transistor;
   a first control wiring that controls, based on the correction signal, a base voltage of the first reference transistor and the first mirror transistor and an emitter voltage of the second mirror transistor; and
   a second control wiring that controls, based on the inverted correction signal, a base voltage of the second reference transistor and the second mirror transistor and an emitter voltage of the first mirror transistor, and
   the superimposing section includes:
   a first correction section that corrects the waveform of the input signal detected by the second detection section, according to the first mirror current; and
   a second correction section that corrects the inverted waveform of the input signal detected by the second detection section, according to the second mirror current.

7. The correction circuit according to claim 1, wherein
   the first detection section detects a waveform and an inverted waveform of the input signal, the amplifying section amplifies the waveform and the inverted waveform of the input signal detected by the first detecting section, the correction signal generating section generates (i) a first correction mirror current in which the correction signal is superimposed on a first mirror current according to a predetermined reference current and (ii) a second correction mirror current in which an inverted correction signal according to an alternate current component extracted from the inverted waveform of the input signal amplified by the amplifying section is superimposed on a second mirror current according to the reference current, and the output signal generating section superimposes the first correction mirror current on the waveform of the input signal and superimposes the second correction mirror current on the inverted waveform, thereby generating a pair of differential signals of the output signal.

8. The correction circuit according to claim 7, wherein the correction signal generating section includes:

a reference transistor that provides the reference current;

a first mirror transistor, a base terminal of the first mirror transistor being connected to a base terminal of the reference transistor; and a second mirror transistor, a base terminal of the second mirror transistor being connected to the base terminal of the reference transistor.

9. The correction circuit according to claim 8, wherein the output signal generating section includes:

a second detection section that detects the waveform of the input signal and the inverted waveform of the input signal; and a superimposing section that superimposes the correction signal on the waveform of the input signal detected by the second detection section, and superimposes the inverted correction signal on the inverted waveform of the input signal detected by the second detection section.

10. The correction circuit according to claim 9, wherein the first mirror transistor provides a first mirror current according to the reference current, the second mirror transistor provides a second mirror current according to the reference current, the correction signal generating section further includes:

a first capacitor that passes an alternate current component of the waveform of the input signal amplified by the amplifying section, thereby generating the correction signal;

a second capacitor that passes an alternate current component of the inverted waveform of the input signal amplified by the amplifying section, thereby generating the inverted correction signal;

a first control wiring that superimposes the correction signal on the first mirror current by controlling an emitter potential of the first mirror transistor based on the correction signal; and a second control wiring that superimposes the inverted correction signal on the second mirror current by controlling an emitter potential of the second mirror transistor based on the inverted correction signal, and the superimposing section includes:

a first correction section that corrects the waveform of the input signal detected by the second detection section, according to the first mirror current; and a second correction section that corrects the inverted waveform of the input signal detected by the second detection section, according to the second mirror current.

11. The correction circuit according to claim 9, wherein the second detection section includes a first differential transistor and a second differential transistor that detect the waveform and the inverted waveform of the input signal, one of the first and second differential transistors is connected to the first mirror transistor, and the other of the first and second differential transistors is connected to the second mirror transistor.

12. The correction circuit according to claim 7, wherein the correction signal generating section includes:

a first reference transistor that provides the reference current;

a second reference transistor that provides the reference current;

a first mirror transistor, a base terminal of the first mirror transistor being connected to a base terminal of the first reference transistor; and a second mirror transistor, a base terminal of the second mirror transistor being connected to a base terminal of the second reference transistor.

13. The correction circuit according to claim 12, wherein the output signal generating section includes:

a second detection section that detects the waveform of the input signal and the inverted waveform of the input signal; and a superimposing section that superimposes the correction signal on the waveform of the input signal detected by the second detection section, and superimposes the inverted correction signal on the inverted waveform of the input signal detected by the second detection section.

14. The correction circuit according to claim 13, wherein the first mirror transistor provides a first mirror current according to the reference current, the second mirror transistor provides a second mirror current according to the reference current, the correction signal generating section further includes:

a first capacitor that passes an alternate current component of the waveform of the input signal amplified by the amplifying section, thereby generating the correction signal;

a second capacitor that passes an alternate current component of the inverted waveform of the input signal amplified by the amplifying section, thereby generating the inverted correction signal;

a first control wiring that controls, based on the correction signal, a base voltage of the first reference transistor and the first mirror transistor and an emitter voltage of the second mirror transistor; and a second control wiring that controls, based on the inverted correction signal, a base voltage of the second reference transistor and the second mirror transistor and an emitter voltage of the first mirror transistor, and the superimposing section includes:

a first correction section that corrects the waveform of the input signal detected by the second detection section, according to the first mirror current; and a second correction section that corrects the inverted waveform of the input signal detected by the second detection section, according to the second mirror current.

15. The correction circuit according to claim 13, wherein the second detection section includes a first differential transistor and a second differential transistor that detect the waveform and the inverted waveform of the input signal, one of the first and second differential transistors is connected to the first mirror transistor, and the other of the first and second differential transistors is connected to the second mirror transistor.

16. A test apparatus for testing a device under test, comprising:
a test signal generating section that generates a test signal to be inputted to the device under test;
a correction circuit that inputs, to the device under test, the test signal generated by the test signal generating section after emphasizing a predetermined signal component of the test signal;
a measurement section that measures a signal under measurement outputted by the device under test according to the test signal; and
a determining section that determines acceptability of the device under test based on a measurement result of the measurement section, wherein
the correction circuit includes:
a first detection section that detects a waveform of the test signal;
an amplifying section that amplifies the waveform detected by the first detection section;
a correction signal generating section that generates a correction signal from an alternate current component of the waveform amplified by the amplifying section; and
an output signal generating section that superimposes the correction signal on the waveform of the test signal, and inputs a resulting test signal to the device under test.

17. The test apparatus according to claim 16, wherein
the first detection section detects a waveform and an inverted waveform of the test signal,
the amplifying section amplifies the waveform and the inverted waveform of the test signal detected by the first detecting section,
the correction signal generating section generates (i) a first correction mirror current in which the correction signal is superimposed on a first mirror current according to a predetermined reference current and (ii) a second correction mirror current in which an inverted correction signal according to an alternate current component extracted from the inverted waveform of the test signal amplified by the amplifying section is superimposed on a second mirror current according to the reference current, and
the output signal generating section superimposes the first correction mirror current on the waveform of the test signal and superimposes the second correction mirror current on the inverted waveform, and inputs a resulting test signal to the device under test.

18. A test apparatus for testing a device under test, comprising:
a test signal generating section that generates a test signal to be inputted to the device under test;
a correction circuit that receives a signal under measurement outputted from the device under test according to the test signal, and obtains a comparison result on whether a level of the signal under measurement is larger than a predetermined level, by compensating for a loss of the signal under measurement in a transfer path; and
a determining section that determines acceptability of the device under test based on the comparison result obtained by the correction circuit, wherein
the correction circuit includes:
a first detection section that detects a waveform of the signal under measurement;
an amplifying section that amplifies the waveform detected by the first detection section;
a correction signal generating section that generates a correction signal by extracting an alternate current component from the waveform amplified by the amplifying section;
an output signal generating section that superimposes the correction signal on the waveform of the signal under measurement; and
a comparison result generating section that generates the comparison result based on the signal generated by the output signal generating section.

19. The test apparatus according to claim 18 wherein
the first detection section detects a waveform and an inverted waveform of the signal under measurement,
the amplifying section amplifies the waveform and the inverted waveform of the signal under measurement detected by the first detection section,
the correction signal generating section generates (i) a first correction mirror current in which the correction signal is superimposed on a first mirror current according to a predetermined reference current and (ii) a second correction mirror current in which an inverted correction signal according to an alternate current component extracted from the inverted waveform of the signal under measurement amplified by the amplifying section is superimposed on a second mirror current according to the reference current, and
the output signal generating section superimposes the first correction mirror current on the waveform of the signal under measurement and superimposes the second correction mirror current on the inverted waveform.

* * * * *